United States Patent
Byeon et al.

(10) Patent No.: US 6,545,910 B2
(45) Date of Patent: Apr. 8, 2003

(54) NON-VOLATILE SEMICONDUCTOR MEMORY DEVICE HAVING WORD LINE DEFECT CHECK CIRCUIT

(75) Inventors: Dae-Seok Byeon, Seoul (KR); Heung-Soo Im, Suwon (KR); Young-Ho Lim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/982,316

(22) Filed: Oct. 18, 2001

(65) Prior Publication Data

US 2002/0145907 A1 Oct. 10, 2002

(30) Foreign Application Priority Data

Apr. 10, 2001 (KR) ........................................ 2001-18845

(51) Int. Cl.[7] .............................................. G11C 16/04
(52) U.S. Cl. .......................... 365/185.17; 365/185.23; 365/185.25
(58) Field of Search ..................... 365/185.25, 185.23, 365/201, 185.01, 189.02, 185.17

(56) References Cited

U.S. PATENT DOCUMENTS 5,602,778 A * 2/1997 Futatsuya et al. ...... 365/185.09
6,307,778 B1 * 10/2001 Micheloni et al. ...... 365/185.09

* cited by examiner

Primary Examiner—Hoai Ho
(74) Attorney, Agent, or Firm—F. Chau & Associates, LLP (57) ABSTRACT

Disclosed is a non-volatile semiconductor memory device provided therein.with a word line defect check circuit. The non-volatile semiconductor memory device includes: a memory cell array including a plurality of cell array blocks including a plurality of cell strings that consist of floating gate memory cell transistors that its drain-source channels are in series connected each other between string select transistors and ground select transistors and that its control gates are correspondingly connected to a plurality of word lines, and a word line short check circuit that inputs different levels of voltage to each of the plurality of word lines that is adjacent from one another during a predetermined charging time, and that generates a short sense signal that indicates whether short between adjacent word lines is occurred by checking voltage levels of the word lines that were supplied with a same level of voltage, after the charging time is lapsed by a predetermined time.

14 Claims, 6 Drawing Sheets

NON-VOLATILE SEMICONDUCTOR MEMORY DEVICE HAVING WORD LINE DEFECT CHECK CIRCUIT

BACKGROUND OF THE INVENTION

1. Field of the Invention

The present invention relates to a non-volatile electrically erasable and, programmable semiconductor memory device, and more particularly, to a non-volatile semiconductor memory device including a defect-check circuit.

2. Description of the Related Art

Semiconductor memory devices can be classified into two groups, volatile semiconductor memory devices and non-volatile semiconductor memory devices. The volatile semiconductor memory devices include dynamic random access memories and static random access memories. The volatile semiconductor memory devices have high speed in read and write modes. However, volatile semiconductor memory devices need a constant external electric power source to store data in a memory cell.

The non-volatile semiconductor memory devices include mask read only memories (MROM), programmable read only memories (PROM), erasable and programmable read only memories (EPROM), and electrically erasable programmable read only memories (EEPROM). Unlike volatile semiconductor memory devices, non-volatile semiconductor memory devices store data in memory cells permanently. However, a user cannot freely write and read (or program) with an electronic system including an MROM, PROM or EPROM. Therefore, a need exists for highly integrated, high performance EEPROM implemented in supplementary memory devices or system-program storage devices that continuously refresh data.

To increase the integration of EEPROM, the area occupied by memory cells in the EEPROM needs to be reduced. A proposed EEPROM includes memory cells of NAND structure wherein the number of contact holes between bit-lines and the number of select transistors per cell can be reduced. Such a NAND structure cell is disclosed on pages 412 to 415 of IEDM published in 1988, under the title of "NEW DEVICE TECHNOLOGIES FOR 5V-ONLY 4Mb EEPROM WITH NAND STRUCTURE CELL". The proposed NAND structure includes a first select transistor including a drain connected to a corresponding bit line via a contact hole, a second select transistor including source connected to a common source line, and a cell string or NAND cell unit, formed of eight memory transistor channels in series connected between the source of the first select transistor and the drain of the second select transistor. The proposed NAND cell string is formed on a substrate of P type semiconductor material. Each memory transistor includes a floating gate on a gate oxide film in a channel region between the source and drain regions, and a control gate formed on the floating gate through an interlayer insulating layer.

To program a memory transistor selected in a cell string, all memories of transistors in the cell string are erased simultaneously prior to programming. Simultaneous erasing of all the memories, or flash erasing, can be performed by supplying 0 Volt to the bit-line and 17 Volt to a gate of the first select transistor and control gates of all the memory transistors. That is, all the memory transistors become transistors of enhancement mode and those are assumed to be transistors programmed by "1" as a binary digit.

To program the selected memory transistor with a binary digit "0", a power of 22 Volts is applied to gates of the first transistor and the bit-line, and a control gate of each of the memory transistors positioned between the first transistors and the selected memory transistors. A power of 0 Volt is applied to a control gate of the selected memory transistor, a gate of the second select transistor and a gate of each of the memory transistors positioned between the selected memory transistor and the source lines. Therefore, the selected memory transistor is programmed according to Fowler-Nordheim tunneling (F-N tunneling) through hole from drain to floating gate.

However, in such a programming method, because a high voltage is applied to the drain of the selected memory transistor, the gate oxide film is stressed, thereby causing leakage current from the thin gate oxide film. Accordingly, the ability to retain data of the memory cell is lowered as a function of the frequency of erasing and programming, thereby reducing the reliability of the EEPROM.

To solve such a problem, there has been proposed an improved device in which NAND cell units are formed at P-type well regions on a N-type semiconductor substrate and an improved erasing and programming technique using the same, on pages 129–130 of "Symposium on VLSI Technology" issued in 1990, under the title of "A NAND STRUCTURED CELL WITH A NEW PROGRAMMING TECHNOLOGY FOR HIGHLY RELIABLE 5V-ONLY FLASH EEPROM". The erasing operation of memory cells in the NAND unit is performed by applying 0V to all of the control gates and a high voltage of 20V to P type well regions and N type substrate. The electronics are uniformly discharged from floating gates of all memory transistors to P-type wells. As a result, the threshold voltage of each of the memory transistors becomes a negative voltage of approximately −4V and the transistor goes to a state of depletion mode by which binary logic "0" is stored.

To program the selected memory transistor in the NAND cell unit, 20V is applied to a gate of the first select transistor and a control gate of the selected memory transistor, 0V is applied to a gate of the second select transistor, and a middle voltage of 7V is applied to a control gate of each of the non-selected memory transistors.

If the selected memory transistor is written or programmed by a binary logic "1", 0V is applied to bit-lines connected to the NAND cell unit and electronics are implanted onto a floating gate of the selected memory transistor, thereby the transistor is changed into an enhancement mode. In contrast, if the selected memory transistor is programmed by a binary logic "0", a middle voltage of 7V that corresponds to a program preventing voltage is applied to the corresponding bit-lines, thereby preventing the programming operation in the selected memory transistor. Such a programming operation allows electronics to be uniformly implanted into the floating gate through a gate oxide from the P type-well, thereby the thin gate oxide film is not stressed, and current leakage in a gate oxide film is prevented.

As described above, since the NAND type of flash EEPROM, including flash erasing which has appeared as EEPROM design technique has been improved, has a higher integration than a NOR type or an AND type of EEPROM, it is preferably applied to large scale supplementary memory devices.

In NAND type lash memory, a memory cell array includes a plurality of cell array blocks including a plurality of cell strings, a plurality of word lines (W/L) arranged in a first direction, for example, in a transverse direction, to select memory cell transistors. The select memory cell transistors include floating gates in the cell strings, and a plurality of bit lines (B/L) arranged in a direction opposite to the first direction, for example, in a longitudinal direction. The W/Ls are electrically connected to control gates of the memory cell transistors. The W/L itself made in a fabricating process plays a role of the control gate. One W/L may be electrically connected to another W/L adjacent to the W/L. Such phenomenon, hereinafter, referred to as W/L short, can result from deposition process, photolithography process, defect in etching process, or defect in design. When such W/L short is created in a chip, it can be difficult for a specific memory cell transistor selected to perform an access operation, that is, reading, writing or programming, or erasing.

A cell memory array of the NAND type flash memory includes a plurality of block units. One block may include a plurality of memory cell transistors, for example, memory cell transistors of 4 k byte. Where a W/L short is created in a memory cell in a block, a test during manufacture needs a defect test technique by which such defect can be checked. After sending out products for a small storage capacity less than a practical storage capacity, an access preventing technique is needed to prevent a user from access to a defected block in the memory. Whether a W/L short is created can be determined in a memory block in a test mode of wafer level or package level. Where the W/L short is checked, a technique is needed wherein the corresponding memory blocks are treated as bad blocks.

Therefore, a need exists for a system and method for a word line defect check implemented in a non-volatile semiconductor memory device.

SUMMARY OF THE INVENTION

Accordingly, it is an object of the present invention to provide a no-volatile semiconductor memory device wherein defects in word lines can be determined.

It is another object of the present invention to provide a semiconductor memory device including a word line defect check circuit that can check defects in word lines and treat the corresponding memory block as bad blocks when defects in word lines are created in a random memory block.

It is yet another object of the present invention to provide a method wherein a word line short is detected in a test mode of package level and an access to a memory block including a word line short can be prevented.

It is still another object of the present invention to provide a non-volatile semiconductor memory device including a performance by which preventing an access to a block can be released if needed although the access to the block including defect of a word line short is prevented.

It is further another object of the present invention to a NAND flash non-volatile semiconductor memory device that can easily check a defected memory block and release a prevention of access or a prevented access.

To achieve the objects, according to an embodiment of the present invention, a non-volatile semiconductor memory device is provided including a memory cell array including a plurality of cell array blocks. Each cell array block includes a plurality of cell strings that include floating gate memory cell transistors wherein drain-source channels are in series connected each other between string select transistors and ground select transistors and that its control gates are correspondingly connected to a plurality of word lines. The non-volatile semiconductor memory device includes a word line short check circuit that applies voltages of different levels to each of the plurality of word lines that is adjacent from one another during a predetermined charging time, and that generates a short detect signal that indicates whether short between adjacent word lines is occurred, by checking voltage levels of the word lines that were supplied with a same level of voltage, after the charging time is lapsed by a predetermined time.

The word line short check circuit preferably includes a bias part for supplying the even word lines of the plurality of word lines with a first voltage and the odd word lines with a second voltage lower than the first voltage during the predetermined charging time, and a sense part for checking voltage, levels of the even word lines to generate a short sense signal after the charging time is lapsed by a predetermined time to check whether short between the odd word lines and the even word lines is created or not.

According to an embodiment of the present invention, a method of testing a short defect between word lines of a non-volatile semiconductor memory device is provided. The non-volatile semiconductor memory device includes a memory cell array including a plurality of cell array blocks. Each cell array block includes a plurality of cell strings including floating gate memory cell transistors wherein its drain-source channels are in series connected each other between string select transistors and ground select transistors and that its control gates are correspondingly connected to a plurality of word lines. The method includes applying different levels of voltage to adjacent word lines out of the plurality of word lines during the predetermined charging time, and checking voltage levels of the word lines that were applied with same levels of voltage among the plurality of word lines after the charging time is lapsed by a predetermined time. The method further includes analyzing the result of checking to generate a short sense signal that indicates whether short between the adjacent word lines is created, and preventing by a block unit cell array blocks from being accessed in a normal operation when the short sense signal is at a state level that word line short is created in the cell array blocks.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS

Figure 1:
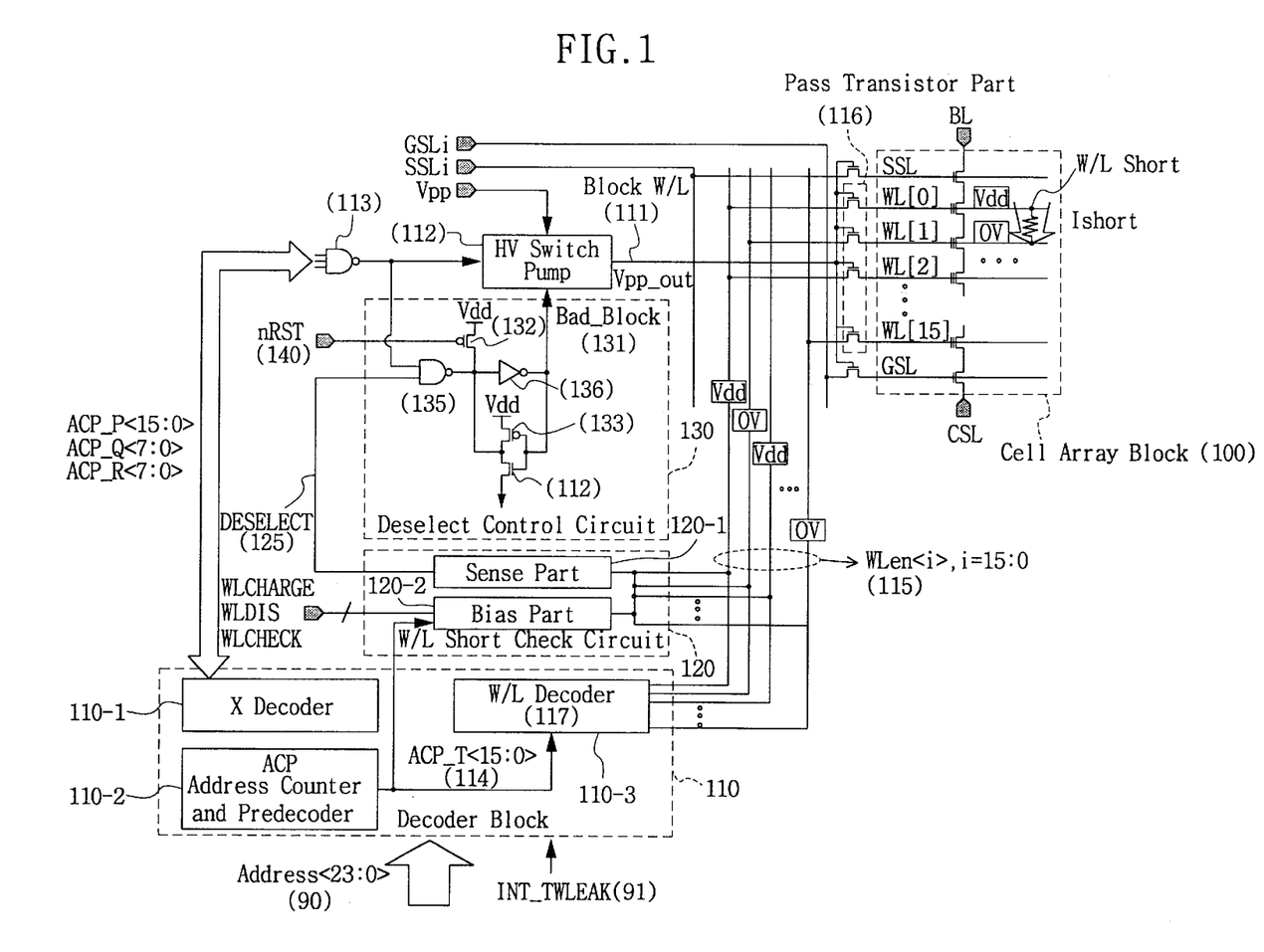
FIG. 1 is a block diagram of a semiconductor memory device that is applied to a W/L short method according to an embodiment of the present invention.

Referring to FIG. 1, which shows a diagram of a semiconductor memory device according to an embodiment of the invention, a cell array block 100 forming memory cell arrays is shown. Although only one cell array block 100 is drawn in FIG. 1 to simplify the drawing and the explanation, a plurality of cell array blocks can be arranged therein.

One cell string in the cell array block 100 comprises a string select (SSL) transistor in which a drain is connected to a corresponding bit line and a gate is connected to a string select line. The cell array block 100 includes a ground select (GSL) transistor including a source connected to a common source line and a gate connected to a ground select line, and 16 memory cell transistors in which drain-source channels are connected in series between the string select (SSL) transistor and a ground select (GSL) transistor.

The cell string can include more than or less than 16 memory cell transistors in response to an application.

The pass transistor part 116 comprises pass transistors including sources connected to the plurality of word lines (WL0–WL15) and gates commonly receiving a block word line (W/L) signal.

The word line short check circuit 120 including a sense part 120-1 and a bias part 120-2 is connected to the drains of the pass transistors through the word line enable bus lines (WLen<i>(i=15:0). The word line short check circuit 120 supplies different levels of voltage to adjacent word lines of a plurality of word lines (WL0–WL15) during a predetermined charging time. The word line short check circuit 120 checks voltage levels of the word lines supplied with a same voltage, thereby generating a short sense signal as a deselect signal 125 indicating whether short between adjacent word lines has occurred after the charging time is lapsed by a predetermined time.

In the drawing, the deselect control circuit 130 stores the short sense signal 125 to prevent the cell array block in which the word line short has occurred from being accessed. The deselect control circuit 130 prevents the switch pump 112 that supplies the block word line with a high voltage from being operated in response to a first level of the short sense signal.

The deselect control circuit 130 comprises a NAND gate 135 for receiving the deselect signal 125 and a pump select signal output from the NAND gate 113 to generate a NAND response. The deselect control circuit 130 includes inverter latches 136, 133 for storing the output of the NAND gate 135 and outputting a bad block signal 131 as a pump disable signal preventing the switch.pump 112 from being operated when the short sense signal is at a first state although addresses are applied to select the plurality of word lines in a normal operation. The deselect control circuit 130 further includes a PMOS transistor 132 in which a drain-source channel is connected to the output terminal of the NAND gate 135 and a voltage Vdd to convert the pump disable signal 131 to an enable signal in response to a reset signal 140 supplied to release the prevented operation of the switch pump 112.

The decoding circuit 110 decodes the block address signals 90 supplied to selectively enable the word line enable bus lines 115 in a normal operation, and supplies the word line short check circuit 120 with an alternative pre decoding signal 114 for applying different levels of voltage to the adjacent word lines in a short check mode.

The decoding circuit 110 comprises a row decoder 110-1 for receiving an input address to decode it, a W/L decoder 117 for outputting the decoding signal to the bus lines 115 WLen<i> that are connected to the pass transistor part 116, and an address counter and pre decoder 110-2 for counting and pre-decoding the input addresses 90. The inputs of the NAND gate 113 are the signals, ACP_P<15:0>, ACP_Q<7:0>, ACP_R<7:0>, and the output of the NAND gate 113 is a logic "L" when an address for selecting the corresponding block is input.

Figure 2:
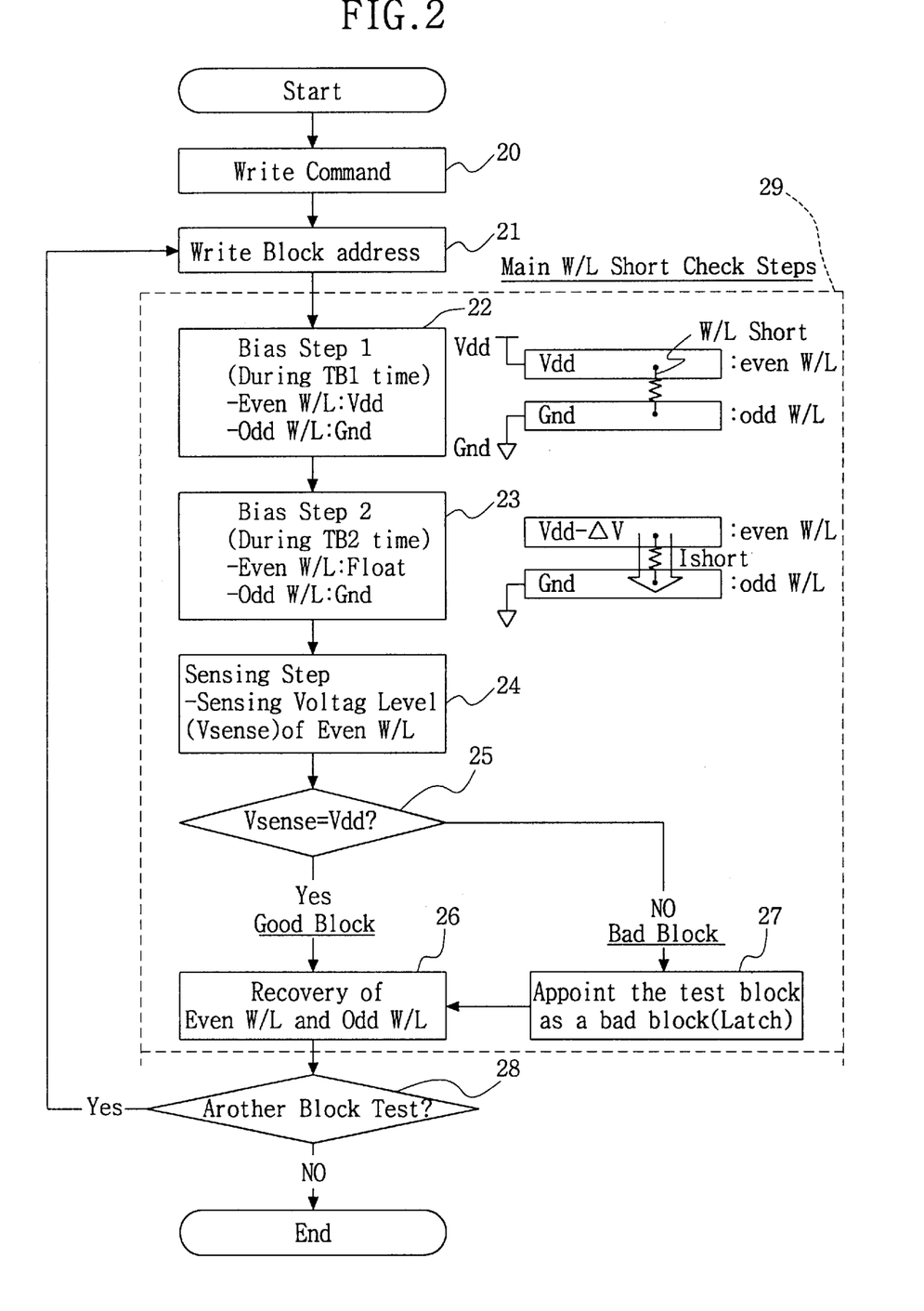
FIG. 2 is a flow chart illustrating an operation according to the short check method shown in FIG. 1 according to an embodiment of the present invention.
Figure 3:
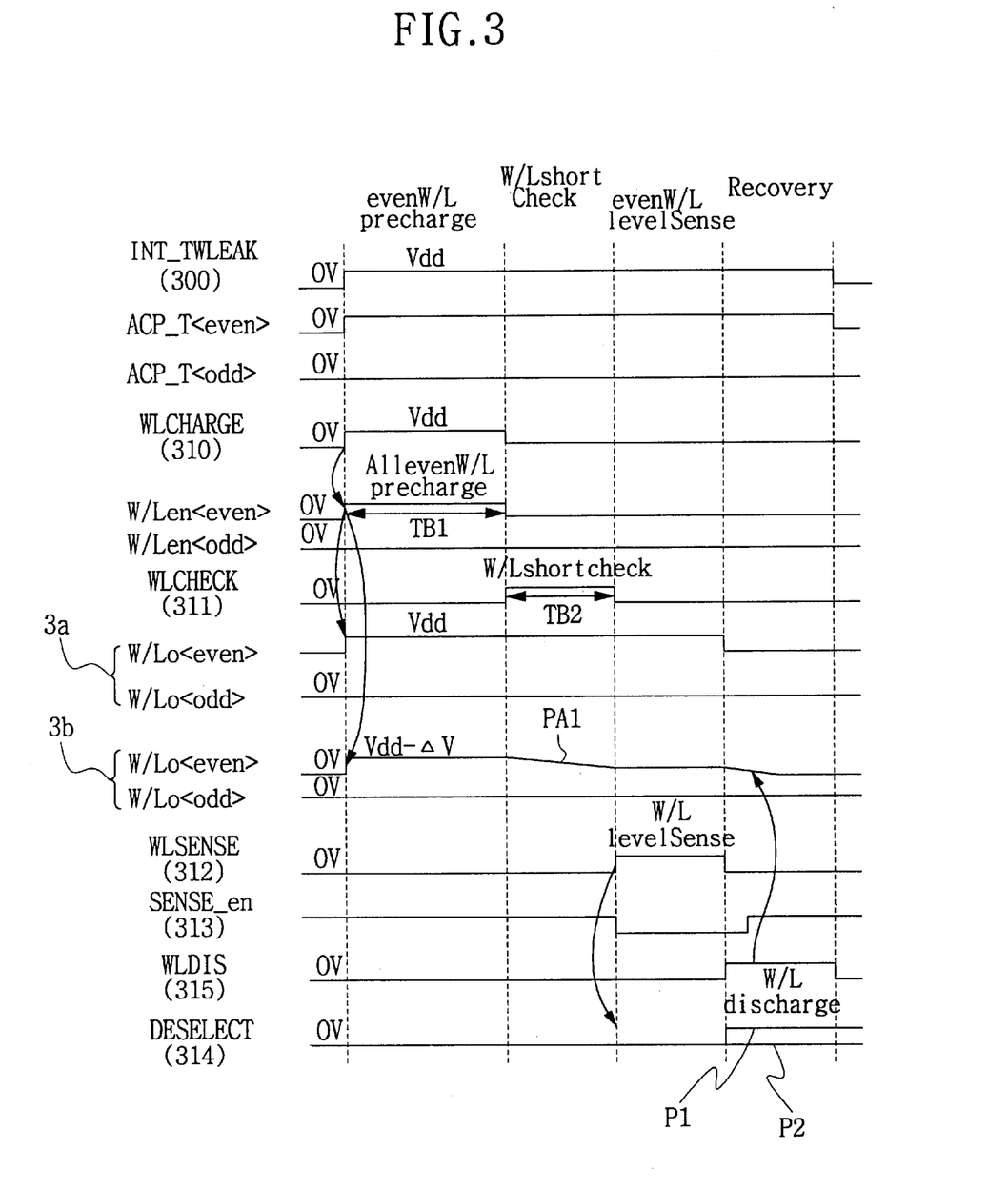
FIG. 3 is an operational timing diagram of the W/L short check according to FIG. 1 according to an embodiment of the present invention.

FIG. 2 is a flow chart showing the operation according to the short check method shown in FIG. 1, in which the method includes the 20 to 28 steps. FIG. 3 is an operational timing view of the W/L short check shown in FIG. 1.

The W/L short check will be explained below with reference to FIGS. 1 and 2 according to the embodiment of the invention. The short check mode input signal INT_TELEAK 91 for driving the original W/L short check operation together with the address signal <23:0>90 are input to the decoder block 110. The address counter and pre-decoder 110-2 (ACP) in the decoder block 110 outputs the signal ACP_T<15:0>114 to each of the word lines W/L to select 8 even W/Ls and not to select the other 8 odd W/Ls. That is, the even numbers ACP T<i> are "H", and the odd numbers ACP T<i> are "L".

The ACP_T<15:0> signal 114 is input to the bias part 120-2 in the W/L decoder 117 and W/L short check circuit 120. The W/L decoder 117 does not operate in the W/L short check mode. The bias part 120-2 in the W/L short check circuit 120 outputs a predetermined level of voltage to the selected even W/Len<i> bus line and 0 volt to the odd W/Len<i> bus line, in response to the ACP_T<i> signal. For example, in the present invention, voltage Vdd is applied to the even W/Len<i> bus line.

Meanwhile, various signals ACP_P<15:0>, ACP Q<7:0>, ACP_R<7:0> are output from the X decoder 110-1 in the decoder block 110 to select memory blocks and input to the NAND gate 113. When the gate 113 outputs the signal "L" to select one block corresponding to a block address, only the high voltage switch pump 112 operates. That is, the switch pumps connected to the other memory block do not operate in response to the signal "H". Each of the switch pumps is commonly assigned per memory block. The switch pump 112 receives the high voltage Vpp in an enable mode and outputs the high voltage Vpp_out to the block W/L 111. As a result, the pass transistors in the pass transistor part 116 receive the high voltage Vpp_out through the gate terminals and are turned on, thereby the signal of the W/Len<15:0> bus line 115 is transferred to the corresponding W/L. In this case, the even W/L receives Vdd and the odd W/L receives 0V, as described in the foregoing. Such an operation corresponds to the bias step 1 of the block 22 as shown in FIG. 2.

The block 22 is performed after the write command step (block 20) for receiving a write command and the write block address step (block 21) for receiving a write block address.

The input time block of Vdd is determined by the input time of the signal WLCHARGE, which is an even W/L pre-charging signal that is input to the bias part 120-2. For example, if it is assumed that the WLCHARGE that is maintained as a high level during the time block TB1 shown in FIG. 3 is input, when the even W/L is sufficiently supplied with the voltage after the time as much as the time TB1 is lapsed, the odd W/Len<i> is continuously supplied with 0V through ground while the even W/Len<i> is maintained as a floating state in which Vdd is not input to the even W/Len<i>, by controlling the bias part 120-2 of the W/L short check circuit. Where, it is noted that the pass transistor 116 still maintains the electrically conductive state, which corresponds to the bias step 2 shown in the block 23 in FIG. 2. At this time, if the pass transistor 116 cannot continuously maintain a conductive state, another pass transistor 116 in the W/L voltage sense block, which will be explained later, becomes a conductive state. Even in this case, the W/L short check operation is normally performed.

While the W/L short phenomenon is not created, the even W/Len<i> continuously maintains voltage of Vdd. However, when short between the even W/L and the odd W/L is occurred, the Vdd of the even W/Len<i> is discharged to the odd W/Len<i> that is connected to ground, thereby the level of voltage is damped, as shown in FIGS. 1 and 2. Such phenomenon is caused by the current Ishort generated, as shown in FIG. 1. As a result, the voltage of the even W/Len<i> decreases from Vdd to Vdd-V. If such operation is maintained for as long as Tb2 in FIG. 3, the difference voltage V increases relatively.

At this step, the sense part 120-1 in the W/L short check circuit 120 operates and detects a voltage level of the even W/Len<i> buss line. At this time, if one or more the even W/Len<i> is detected as including a voltage level less than the Vdd, the sense part 120-1 outputs the deselect signal 125 as a logic "H". This operation corresponds to the blocks 24 and 25, as shown in FIG. 2.

If Vsense=Vdd in the sensing step, the block 26 follows, if not, the block 27 follows. The DESELECT signal is input to the deselect control circuit 130 and input to the inverter latch including the inverter 136, NMOS 112, PMOS 133. The Bad_Block signal 131 outputted from the inverter latch is output as a logic "H" when W/L short is occurred. As a result, the switch pump 112 is disabled in its operation, thereafter the switch pump 112 does not operate even though the select address signal Address<23:0>90 is input. Since the select operation of the block is accordingly intercepted, memory blocks including defects are treated as bad blocks.

If a user needs such a bad block treatment operation be cancelled, the PMOS 132 including a high driving power should become conductive (turned-on state) and the signal of the bad block 131 should be shifted into a logic "L" by inputting the nRST signal 140 as a logic "L". If the PMOS 132 is not turned on, the signal of the bad block 131 is not transferred to the state of logic "L" even by the NMOS 112 including current driving power lower than the PMOS but higher than that of the PMOS of the common gates 135, 136.

The foregoing operation will be better understood with reference to FIG. 3. In FIG. 3, when the external signal INT_TWLEAK 300 becomes a state of logic "H" for the W/L short check operation, a plurality of the even ACP_T<i> are transferred to "H" and a plurality the odd ACP_T<i> are transferred to "L". In the case that a W/L short phenomenon is not created, the voltage level of the even W/L maintains Vdd and the voltage level of the odd W/L maintains 0V. In contrast, in the event that a W/L short phenomenon is created, the voltage level of the even W/L is indicated as reduced by a predetermined level relative to the Vdd, which is indicated as a symbol PA1. Where, the time that the even W/L is charged by Vdd is set by TB1, and the time the even W/L maintains a floating state is set by TB2. If the charging time TB1 is not enough, there is a possibility that the W/L and the W/Len<i> bus lines are not supplied with the full Vdd. In addition, if the time TB2 for maintaining a floating state is not enough, there is a possibility that since the discharge time is short, the voltage Vdd of the even W/L is not so reduced even though the W/L short is created, thereby the sense operation of the sense part 120-1 is difficult to operate.

The word line short check operation as described above can be summarized by the following: The even W/L are charged. The even W/L is charged by the voltage Vdd during the TB1. The signal for determining the TB1 as an external input signal is provided as the signal WLCHARGE 310 in FIG. 3. The plurality of the even W/L are charged with the voltage Vdd and at the same time the plurality of the odd W/L maintains 0V during the time TB1.

Charging the even W/L with the voltage Vdd during the TB1 includes checking the W/L short. The even W/L are floated and the odd W/L are grounded during the time TB2. At this time, the signal for determining the time TB2 is an external input signal corresponding to the signal WLCHECK 311 shown in FIG. 3. When a W/L short is created between adjacent even and odd W/L, the voltage of the even W/L is discharged through the odd W/L and decreased. When a W/L short is not created, the plurality of the even W/Ls maintain the voltage Vdd as set, and the plurality of the odd W/L maintain 0V.

Provided a signal for determining the TB1 as an external input signal as the signal WLCHARGE 310 in FIG. 3, includes sensing the voltage of the even W/L. To sense the voltage level of the plurality of the even W/Ls, the voltage of the even W/L is input to the sense part 120-1 connected to the even W/Len bus line via the turned-on pass transistor 116. In case that one or more even W/Len bus lines are reduced from the Vdd to below a logic threshold voltage, the W/L are regarded as being created and the deselect signal 314 as an output signal is generated, as shown in FIG. 3. When the external input signals WLSENSE 312 and SENSE_en 313 that allows the sense part to operate are input at the step for sensing the voltage level of the even W/L, the sense part 120-1 receives the voltage value of the even W/Len bus line to thereby store it in the latch provided therein and at the same time to output the deselect signal 314 as an output signal.

As described above, if the W/L short is created, the signal DESELECT 314 in FIG. 3 is shifted to "H" and output. If the W/L short is not created, the DESELECT 314 is output as "L". The DESELECT signal 314 is input to the deselect control circuit 130 shown in FIG. 1. As a result, the deselect control circuit 130 serves to store information in the latch provided therein and at the same time to determine whether the switch pump 112 is allowed to operate.

Charging the plurality of even W/L and the plurality of odd W/L to Vdd is a restoring function. The voltage of the plurality of W/L bus lines and W/Len bus lines, which are of a positive voltage, not 0V, are discharged. The external input signal WLDIS 315, for setting the signal block is input as "H" during a predetermined time, is maintained as a state of "L" when discharge is completed.

Figure 4:
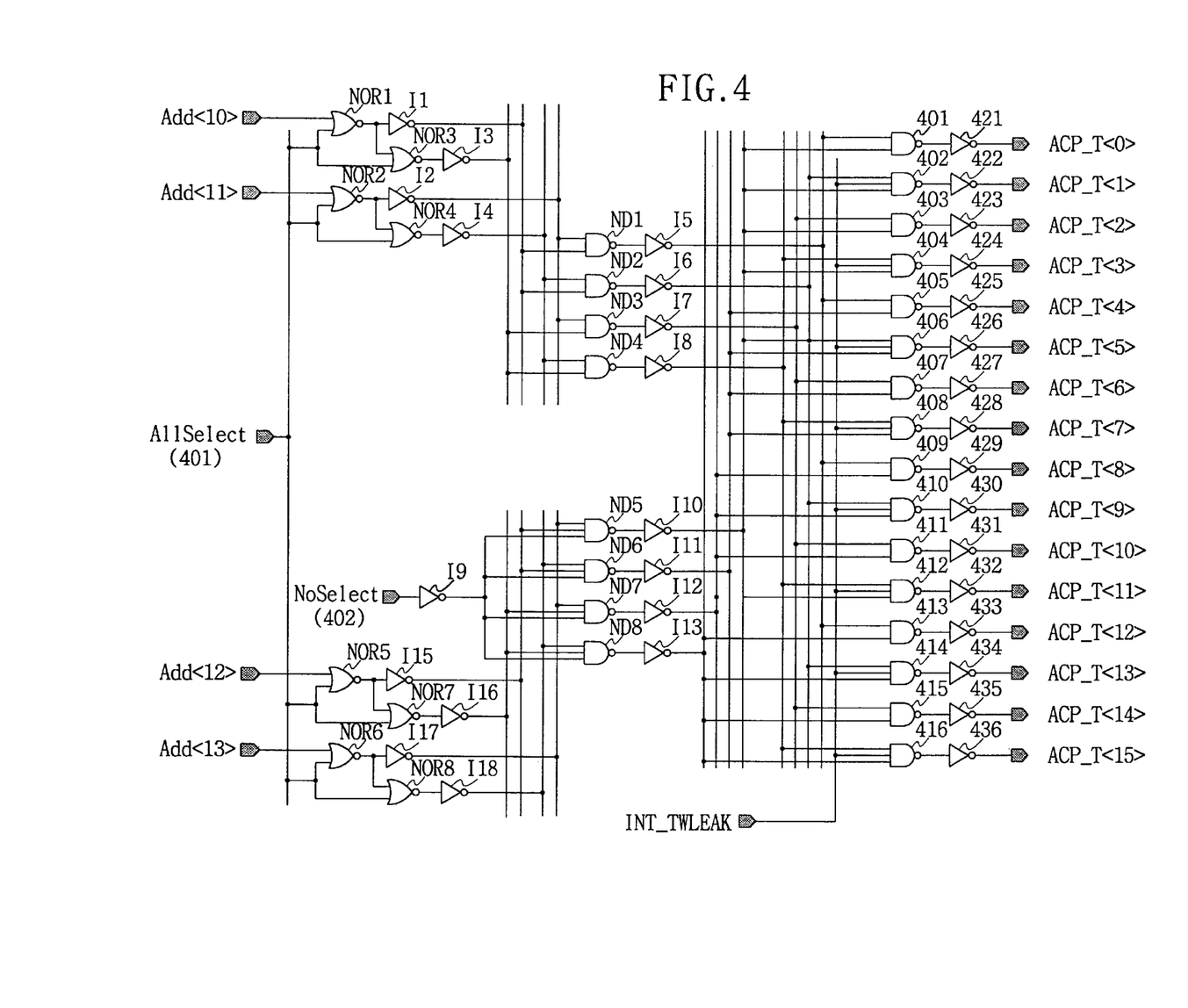
FIG. 4 is a detailed view of the address counter and pre-decoder shown in FIG. 1 according to an embodiment of the present invention.

FIG. 4 shows a detailed view of the address counter and the pre-decoder as shown in FIG. 1, where also shows the plurality of logic gate devices that are connected to each other. At the state that the external signal INT_TWLECK for the W/L short check operation is input as "H", when the AllSelect signal 401 is input as "H" and the NoSelect signal 402 is input as "L", an output signal corresponding to the W/L short check operation is determined. That is, to select 8 even W/Ls, the even ACPT<i> is output as "H", and to deselect 8 odd W/Ls, the odd ACP_T<i> is output as "L".

Figure 5A:
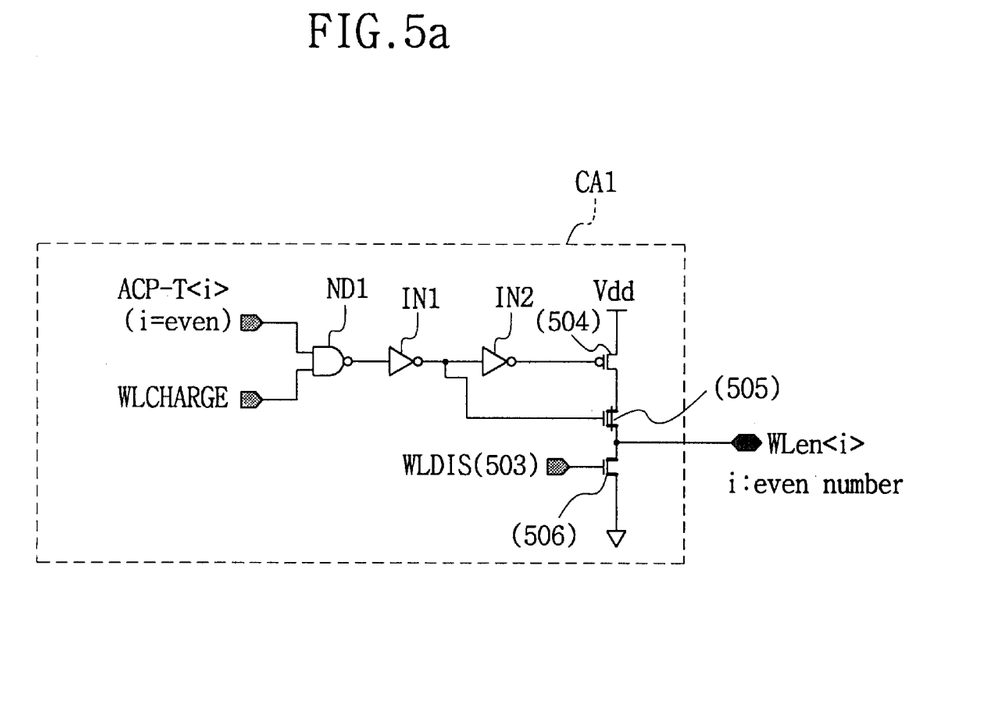
FIG. 5a is a detailed view of the even word line bias part in the word line short check circuit shown in FIG. 1 according to an embodiment of the present invention.
Figure 5B:
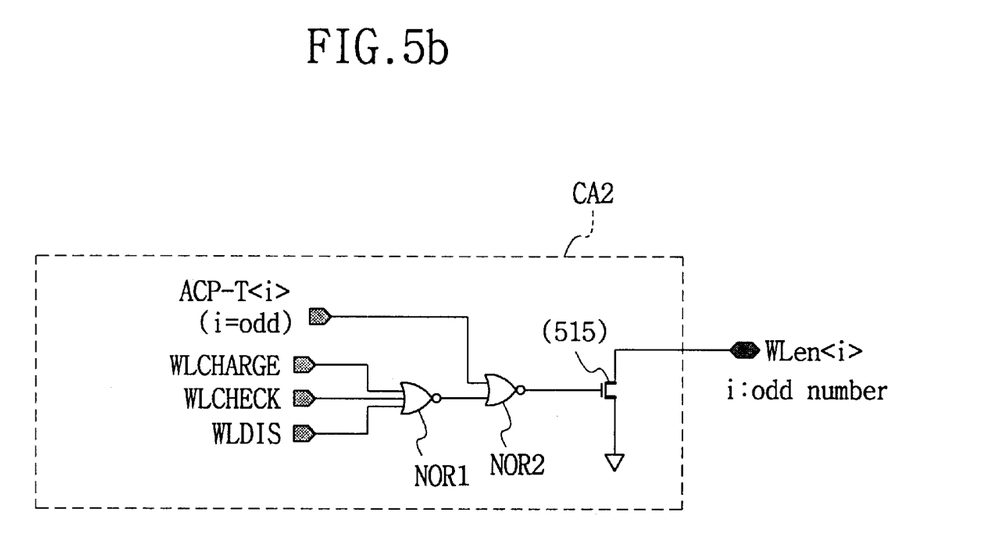
FIG. 5b is a detailed view of the odd word line bias part in the word line short check circuit shown in FIG. 1 according to an embodiment of the present invention.

FIG. 5a is a detailed view of the even word line bias part in the word line short check circuit shown in FIG. 1, and FIG. 5b is a detailed view of the odd word line bias part in the word line short check circuit shown in FIG. 1. The bias parts serve to input or discharge voltage to the WLen<15:0> bus line 115.

Referring to FIG. 5a, the even word line bias part comprises a logic gate part ND1, IN1, IN2 for generating first and second internal charge signals including levels opposite to each other by a logic combination of an alternative pre-decoding signal ACP-T<i> input from a decoding circuit and a charging signal WLCHARGE input during the charging time. The even word line bias part further includes a PMOS transistor 504 for receiving the first internal charge signal through a gate and receiving the power supply voltage through a source and a voltage output part including a NMOS transistor 505 for a high voltage that its drain is connected to a drain of the PMOS transistor and its source is connected to the even word line enable bus line, the transistor receiving the second internal charge signal through its gate to thereby input the first power supply voltage to the even word line enable bus line. The even word line bias part includes a discharge part including a NMOS transistor 506 that is connected between the drain terminal of the NMOS transistor 505 and ground to receive through its gate a discharge signal WLDIS that is input after the short sense signal is generated thereby discharging through ground the first power supply voltage that was supplied to the even word lines.

To supply Vdd to the WLen<i>, the ACP_T<i> is input as a logic of "H", the charge signal WLCHARGE 502 as "H", and the discharge signal WLDIS 503 of the word line as "L", respectively. Then, the PMOS transistor 504 and the depletion NMOS transistor 505 are turned on, thereby the Vdd is input to the even WLen<i>. In contrast, to supply 0V to the even WLen<i>, the charge signal of the W/L, WLCHARGE 502, is input as "L", and the W/L discharge signal, WLDIS 503, is input as "H", then the NMOS transistor 506 is turned on, thereby the voltage of the WLen<i> is discharged to 0V through ground.

The odd word line bias part as shown in FIG. 5b comprises a logic gate part NOR1, NOR2 for generating a third internal charge signal by logic combinations of the check signal and the discharge signal, and the charge signal and the alternative pre-decoding signal that are input from the decoding circuit 110. The odd word line bias part further includes a low voltage output part including a NMOS transistor 515 that its drain-source channel is connected between the odd word line enable bus line and ground, the transistor receiving the third internal charge signal through its gate to thereby input the second power supply voltage to the odd word line enable bus line.

FIG. 5b shows a circuit by which 0V is input to the odd WLen<i> bus line. If The ACP_T<i> is "H", the charge signal WLCHARGE 511 is "H", or the W/L discharge signal WLCHECK 513 is "H", or the WLDIS 514 is "H", then the NMOS transistor 515 is turned-on to thereby 0V is input to the WLen<i>.

Figure 6:
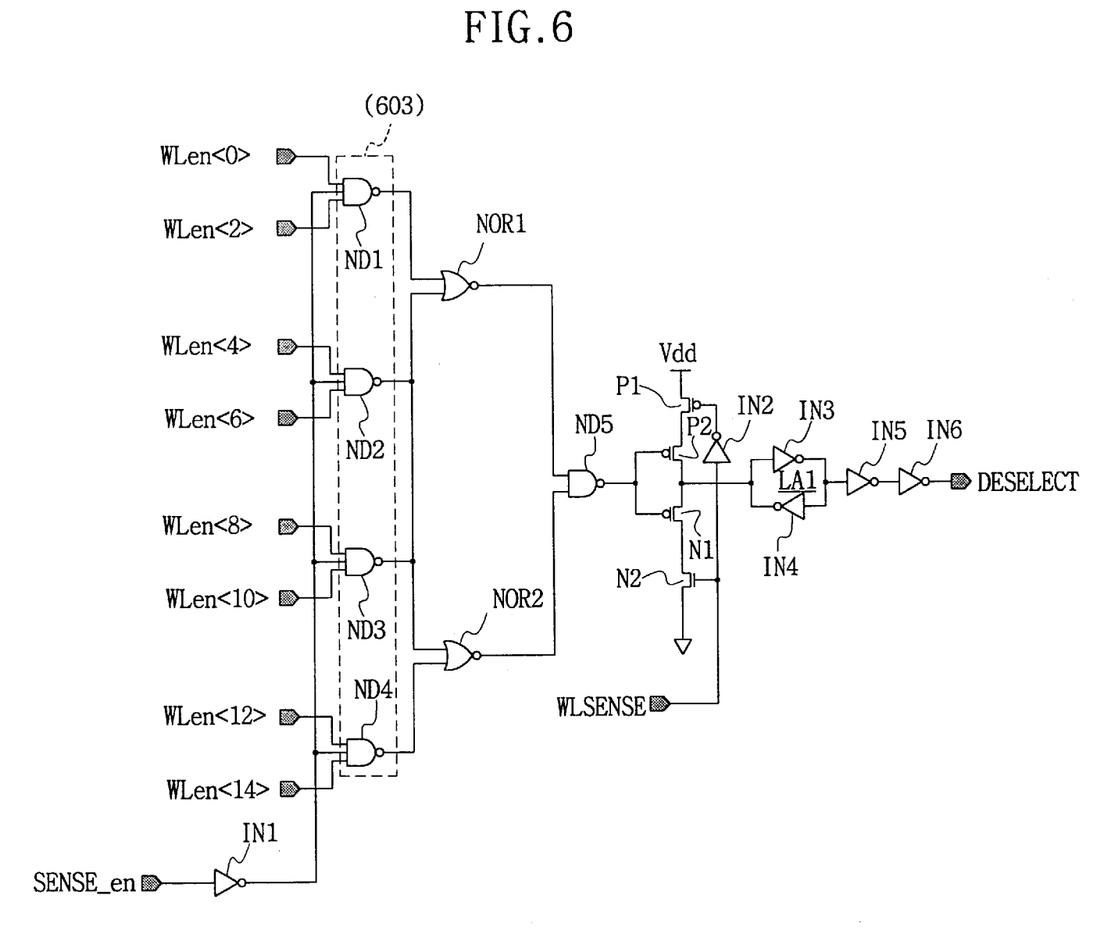
FIG. 6 is a detailed view of the sense part in the word line short check circuit shown in FIG. 1 according to an embodiment of the present invention.

FIG. 6 is a detailed view of the sense part 120-1 in the word line short check circuit in FIG. 1.

The sense part is a circuit for sensing the voltage level of the even WLen<i>. The sense part comprises: a logic combination part including 603, NOR1, NOR2, ND5 for outputting a sense synthesizing signal by logically combining of the outputs of the enable bus line of the even word line in response to the sense enable signal SENSE_en; and a sense signal output part for latching and outputting the sense synthesizing signal in response to the sense signal WLSENSE to output the deselect signal DESELECT as the short sense signal.

Referring to FIG. 6, when the signal WLSENSE_en is "H" and the signal SENSE_en is "H", the sense part 120-1 is in an operable state. At this time, if the voltage level of the even WLen<i> is in a voltage level of Vdd as originally charged, the NAND gate part 603 senses the signal of even WLen<i> as "H". Accordingly, the sense part 1201 outputs the output signal DESELECT 605 as "L". That is, a normal state that the W/L short has not occurred. In contrast, in case that the W/L short is created and one or more the voltage levels of the even WLen<i> is reduced to below the logic threshold voltage of the NAND gate 603, the NAND gate senses the even WLen<i> signal as "L" and finally outputs the DESELECT 605 as "H". That is, it indicates the bad block in which the W/L short is occurred. The deselect signal is used as a signal for determining whether to operate the switch pump 112 for high voltage.

The foregoing explanations are limited to embodiments according to the present invention. However, the present invention can be modified or changed within the scope or technical spirit of the present invention. For example, even in the case of memories such as DRAM or SRAM, word line short can be checked thereby preventing the corresponding block from being accessed.

In the foregoing, the power supply voltage is input to the even word line and ground voltage is input to the odd word line, but the ground voltage may be input to the even word line to the contrary.

In addition, the logic gates shown in drawings may be replaced with other equivalent circuit devices or other logic devices.

As described above, according to the present invention by which the word line short can easily be detected and memory block including word line short cannot be accessed, defect in word lines of a semiconductor memory device can easily be checked. In addition, in case that defects in word lines of memory blocks are created, there are advantages that the defects can easily be checked and the corresponding memory blocks are treated as bad blocks.

What is claimed is:

1. A non-volatile semiconductor memory device, comprising:
  a memory cell array including a plurality of cell array blocks, each cell array block including a plurality of floating gate memory cell transistors including a plurality of drain-source channels connected in series between a string select transistor and a ground select transistor, wherein a plurality of control gates are connected to a plurality of corresponding word lines; and
  a word line short check circuit connected to the plurality of word lines, wherein the word line short check circuit inputs different voltages to word lines adjacent to one another during a predetermined charging time, generating a short sense signal upon determining a voltage level of a word line to be different from the voltage input to the word line after the charging time is lapsed by a predetermined time.

2. The non-volatile semiconductor memory device as defined in claim 1, wherein the word line short check circuit comprises:
  a bias part for supplying a first set of word lines of the plurality of word lines with a first voltage and a second set of word lines with a second voltage lower than the first voltage during the predetermined charging time in a short check mode, wherein each word line of the first set is adjacent to a corresponding word line of the second set; and
  a sense part for checking voltage levels of the first set word lines to generate a short sense signal after the charging time is lapsed by a predetermined time to determine whether short between the adjacent word lines is created or not.

3. The non-volatile semiconductor memory device as defined in claim 2, further comprising:

to prevent cell array blocks including therein word line short defects from being accessed, a deselect control circuit for preventing a switch pump from supplying a high voltage to a block line connected to each gate of a plurality of pass transistors connected to the plurality of word lines in response to a first state of the short sense signal, wherein an address signal for selecting the plurality of word lines is input.

4. The non-volatile semiconductor memory device as defined in claim 3, wherein the deselect control circuit further comprises a reset part for shifting a first state of the short sense signal to a second state in response to a reset signal to deselect the prevented state of the switch pump operation.

5. The non-volatile semiconductor memory device as defined in claim 2, wherein the bias part further comprises a discharge path for discharging the first voltage supplied to the first wet of word lines after the short sense signal is generated.

6. A semiconductor memory device, comprising:

a memory cell array including a plurality of cell array blocks including a plurality of memory cell that is intersected in a matrix form between a plurality of word lines and a plurality of bit lines; and a word line short check circuit connected to the plurality of word lines, wherein the word line short check circuit inputs different voltages to word lines adjacent to one another during a predetermined charging time, generating a short sense signal upon determining a voltage level of a word line to be different from the voltage input to the word line after the charging time is lapsed by a predetermined time.

7. A method of testing short defect between word lines of a non-volatile semiconductor memory device including a memory cell array including a plurality of cell array blocks including a plurality of cell strings that include a plurality of floating gate memory cell transistors that its drain-source channels are in series connected each other between string select transistors and ground select transistors and that its control gates are correspondingly connected to a plurality of word lines, comprising the steps of:

applying different a first and a second voltage to adjacent word lines respectively of the plurality of word lines during a predetermined charging time;

checking voltage levels of the word lines that were applied with same levels of voltage after the charging time is lapsed by a predetermined time;

generating a short sense signal upon determining a short between the adjacent word lines; and preventing a block unit cell array blocks from being accessed in a normal operation when the short sense signal is at a level state that word line short is created in the cell array blocks.

8. A non-volatile semiconductor memory device including a programmable function and a erasable function, comprising:

a memory cell array including a plurality of cell array blocks, each cell array block including a plurality of floating gate memory cell transistors including a plurality of drain-source channels connected in series between a string select transistor and a ground select transistor, wherein a plurality of control gates are connected to a plurality of corresponding word lines;

a plurality of pass transistors including a plurality of sources connected to corresponding terminals of the plurality word lines, and a plurality of gates receiving a block word line signal;

a word line short check circuit connected to a plurality of drains of the pass transistors through a word line enable bus lines, wherein the word line short check circuit inputs different voltages to word lines adjacent to one another during a predetermined charging time, generating a short sense signal upon determining a voltage level of a word line to be different from the voltage input to the word line after the charging time is lapsed by a predetermined time;

a deselect control circuit that stores the short sense signal to prevent the cell array block in which word line short is created form being accessed, and to prevent the switch pump for supplying the block word lines with high voltage from being operated in response to the first state of the short sense signal even though an address selecting the plurality of the word lines is input in a normal operation; and a decoding circuit for decoding the block address signals input in the normal operation to selectively enable the word line enable bus lines and for providing the word line short check circuit with an alternative pre-decoding signal to supply each of the adjacent word lines with different levels of voltage in a short check mode.

9. The non-volatile semiconductor memory device as defined in claim 8, wherein the word line short check circuit comprises:

a bias part for supplying the first set of word lines of the plurality of word lines with a first voltage and the second set of word lines with a second voltage lower than the first voltage during the predetermined charging time in a short check mode; and a sense part for checking voltage levels of the first set of word lines to generate a short sense signal after the charging time is lapsed by a predetermined time to check whether short between the second set of word lines and the first set of word lines is created or not.

10. The non-volatile semiconductor memory device as defined in claim 9, wherein the bias part comprises a first set word line bias part and a second set word line bias part, wherein the first set of word line bias part comprises:

a logic gate part for generating first and second internal charge signals including levels opposite to each other by a logic combination of an alternative pre-decoding signal input from the decoding circuit and a charge signal input during the charging time;

a voltage output part including a PMOS transistor for receiving the first internal charge signal through a gate and receiving the power supply voltage through a, source and a NMOS transistor for a high voltage that its drain is connected to a drain of the PMOS transistor and its source is connected to the first set of word line enable bus line, the NMOS transistor receiving the second internal charge signal through its gate to thereby input the first power supply voltage to the first set of word line enable bus line; and a discharge part including a NMOS transistor that is connected between the drain terminal of the NMOS transistor and ground to receive through its gate a discharge signal input after the short sense signal is generated thereby discharging through ground the first power supply voltage that was supplied to the first set of word lines.

11. The non-volatile semiconductor memory device as defined in claim 9, wherein the second set of word line bias part comprises:

a logic gate part for generating a third internal charge signals by a logic combination of the alternative pre-decoding signal input from the decoding circuit, the charge signal input, and the check signal, discharge signal; and a low voltage output part including a NMOS transistor that its drain-source channel is connected between the second set of word line enable bus line and ground and that receives the third internal charge signal through its gate to input the second power supply voltage to the second set of word line enable bus line.

12. The non-volatile semiconductor memory device as defined in claim 9, wherein the sense part comprises:

a logic combination part for outputting a sense synthesizing signal by logically combining of the outputs of the first set word line enable bus line in response to the sense enable signal; and a sense signal output part for latching and outputting the sense synthesizing signal in response to the sense signal to output the deselect signal as the short sense signal.

13. The non-volatile semiconductor memory device as defined in claim 8, wherein the deselect control circuit comprises:

a NAND gate for receiving the deselect signal and a pump select signal to generate a NAND response;

inverter latches for storing the output of the NAND gate and outputting the bad block signal as a pump disable signal to prevent the switch pump from being operated when the short sense signal is at the first state even though addresses are applied to select the plurality of word lines in a normal operation; and a PMOS transistor which its drain-source channel is connected to the output terminal of the NAND gate and the power supply voltage to convert the pump disable signal to an enable signal in response to a reset signal that is supplied to release the prevented operation of the switch pump.

14. A method of testing short defect between word lines of a non-volatile semiconductor memory device including a memory cell array including a plurality of cell array blocks including a plurality of cell strings that consist of floating gate memory cell transistors that its drain-source channels are in series connected each other between string select transistors and ground select transistors and that its control gates are correspondingly connected to a plurality of word lines, comprising the steps of:

determining whether short between word lines is created by sensing voltage level of the second set of word lines after floating voltage between the second set of word lines during a predetermined time at the state that the second set of word lines are supplied with the first power supply voltage and the first set of word lines are supplied with the second power supply voltage lower than the first power supply voltage; and preventing the cell array block in which short is created from being accessed per block in a normal operation.

\* \* \* \* \*